United States Patent [19]
Yurchenco et al.

[11] Patent Number: 5,856,910
[45] Date of Patent: Jan. 5, 1999

[54] PROCESSOR CARD ASSEMBLY HAVING A COVER WITH FLEXIBLE LOCKING LATCHES

[75] Inventors: James R. Yurchenco; Alexander Z Nosler, both of Palo Alto, Calif.

[73] Assignee: Intel Corporation, Santa Clara, Calif.

[21] Appl. No.: 739,815

[22] Filed: Oct. 30, 1996

[51] Int. Cl.⁶ .................................................. H05K 7/20
[52] U.S. Cl. ....................... 361/704; 361/715; 361/732; 361/754; 361/759
[58] Field of Search ..................... 361/704, 707, 361/709–710, 714–721, 728, 730, 732, 737, 740, 752–754, 756, 759

[56] References Cited

U.S. PATENT DOCUMENTS

| | | | |
|---|---|---|---|
| 4,226,491 | 10/1980 | Kazama et al. | 361/759 |
| 4,716,498 | 12/1987 | Ellis | 361/715 |
| 4,763,300 | 8/1988 | Yukawa . | |
| 4,844,465 | 7/1989 | Hibino et al. . | |
| 4,865,321 | 9/1989 | Nakagawa et al. . | |
| 4,916,575 | 4/1990 | Van Asten | 361/715 |
| 4,984,193 | 1/1991 | Nakagawa . | |
| 5,014,982 | 5/1991 | Okada et al. . | |
| 5,161,803 | 11/1992 | Ohara . | |
| 5,226,136 | 7/1993 | Nakagawa . | |
| 5,265,888 | 11/1993 | Yamamoto et al. . | |
| 5,276,831 | 1/1994 | Nakanishi et al. . | |
| 5,317,714 | 5/1994 | Nakagawa et al. . | |
| 5,396,401 | 3/1995 | Nemoz | 361/759 |
| 5,426,763 | 6/1995 | Okada . | |
| 5,453,763 | 9/1995 | Nakagawa et al. . | |
| 5,460,374 | 10/1995 | Owaki . | |
| 5,470,080 | 11/1995 | Naka et al. . | |
| 5,537,389 | 7/1996 | Kuwa et al. . | |
| 5,550,999 | 8/1996 | Nagano et al. . | |
| 5,592,609 | 1/1997 | Suzuki et al. . | |

*Primary Examiner*—Gregory Thompson
*Attorney, Agent, or Firm*—Blakely, Sokoloff, Taylor & Zafman LLP

[57] ABSTRACT

The processor card assembly of the present invention includes a processor card, a thermal plate and a cover with locking latches. The thermal plate and the cover form a case for housing the processor card. The locking latches are used to latch the processor card assembly to a retention apparatus for securing the processor card assembly, such that the processor card will remain connected to a receiving connector of a motherboard, under a variety of shock and vibration conditions. In some embodiments, the complementary fastening features of the thermal plate and the cover are temper resistance.

11 Claims, 7 Drawing Sheets

PROCESSOR CARD ASSEMBLY HAVING A COVER WITH FLEXIBLE LOCKING LATCHES

BACKGROUND OF THE INVENTION

1. Field of the Invention

The present invention relates to the field of microprocessor based computer systems. More specifically, the present invention relates to the packaging of high performance microprocessors on daughter cards.

2. Background Information

Historically, when microprocessor was first commercialized, each microprocessor held less than one million transistors, and operated at speeds below 20 MHz. Typically, the microprocessors were either solder mounted onto the motherboards directly or mounted to the motherboards through sockets. They were typically air cooled, and air flow was typically sustained by a system fan. Electromagnetic interference (EMI) and/or electrostatic discharge (ESD) shielding were not much of a concern.

In the pursuing years, the number of transistors packed into each microprocessor, as well as its operating speed have increased dramatically, especially in recent years. Correspondingly, the amount of heat that needs to be dissipated, as well as the amount of EMI emissions that needs to be absorbed and sensitivity to ESD during operation have increased. As a result, most of today's microprocessor based computer systems employ either local fans and/or heat sinks to help ensure that the microprocessors will run cool. At the same time, increased attentions have also been given to the design of system chassis to ensure the EMI emission absorption and ESD requirements are met.

This trend of increased transistor density and operating speed is expected to continue without any abatement. By the end of this year, it is expected that a typical desktop computer system will be powered by a microprocessor packing well over five million transistors, and operating in speeds in excess of 200 MHz. It is expected that because of the amount of heat needs to be dissipated, the precision of bonding between the processor and heat sink will reach a point of critical importance to ensure the processor will be cooled properly during operation. It is also expected that the size of the heat sink required for any one of these processors will be increased to a point that the spatial constraints imposed by the various de-facto system chassis form factors' must be addressed. In other words, it is unlikely that one heat sink will work (size-wise) for the various de-facto system chassis. At the same time, it is expected that the present system chassis based solution for EMI emission and/or ESD containment will no longer be adequate.

The heat sink problem is a dilemma for processor manufacturers. On one hand, because of the critical importance of the precision of bonding between a processor and a heat sink, a processor manufacturer cannot simply leave the job of bonding heat sinks to these high performance processors to the OEMs. However, if the processor manufacturers were to shoulder the burden of bonding the heat sinks, under the prior art, in addition to the burden of having to deal with yet another increase in heat sink size, the new burden of having to have multiple versions of heat sinks for one processor, the processor manufacturer will also have to shoulder the burden of having to stock and ship multiple versions of a processor bonded with different types of heat sinks.

Thus, a processor card assembly, employing a cover and a thermal plate to form a case, has been developed to house the processor card having the high performance processor mounted thereon. See U.S. patent application Ser. No. 08/723,027, entitled "A processor card assembly including a heat sink attachment plate and an EMI/ESD shielding case". The application has common assignee interest with the present invention.

Additionally, it is also important for a processor card assembly constituted in accordance with the teachings of the above identified U.S. Patent Application to be properly retained, to keep the processor card connected to the receiving connector of the motherboard, notwithstanding a variety of shock and vibration conditions. It is important for these desired retention characteristics to be achieved with a retention apparatus that is simple in design to reduce design and manufacturing cost. It is also important for the engagement of the processor card assembly with the retention apparatus be simple to improve manufacturability.

SUMMARY OF THE INVENTION

The processor card assembly of the present invention includes a processor card, a thermal plate and a cover with locking latches. The thermal plate and the cover form a case for housing the processor card. The locking latches are used to latch the processor card assembly to a retention apparatus for securing the processor card assembly, such that the processor card will remain connected to a receiving connector of a motherboard, under a variety of shock and vibration conditions.

In some embodiments, the complementary fastening features of the thermal plate and the cover are temper resistance. In other embodiments, the processor card assembly further includes a skirt for covering and protecting the pins of the processor card.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without the specific details.

Figure 1:
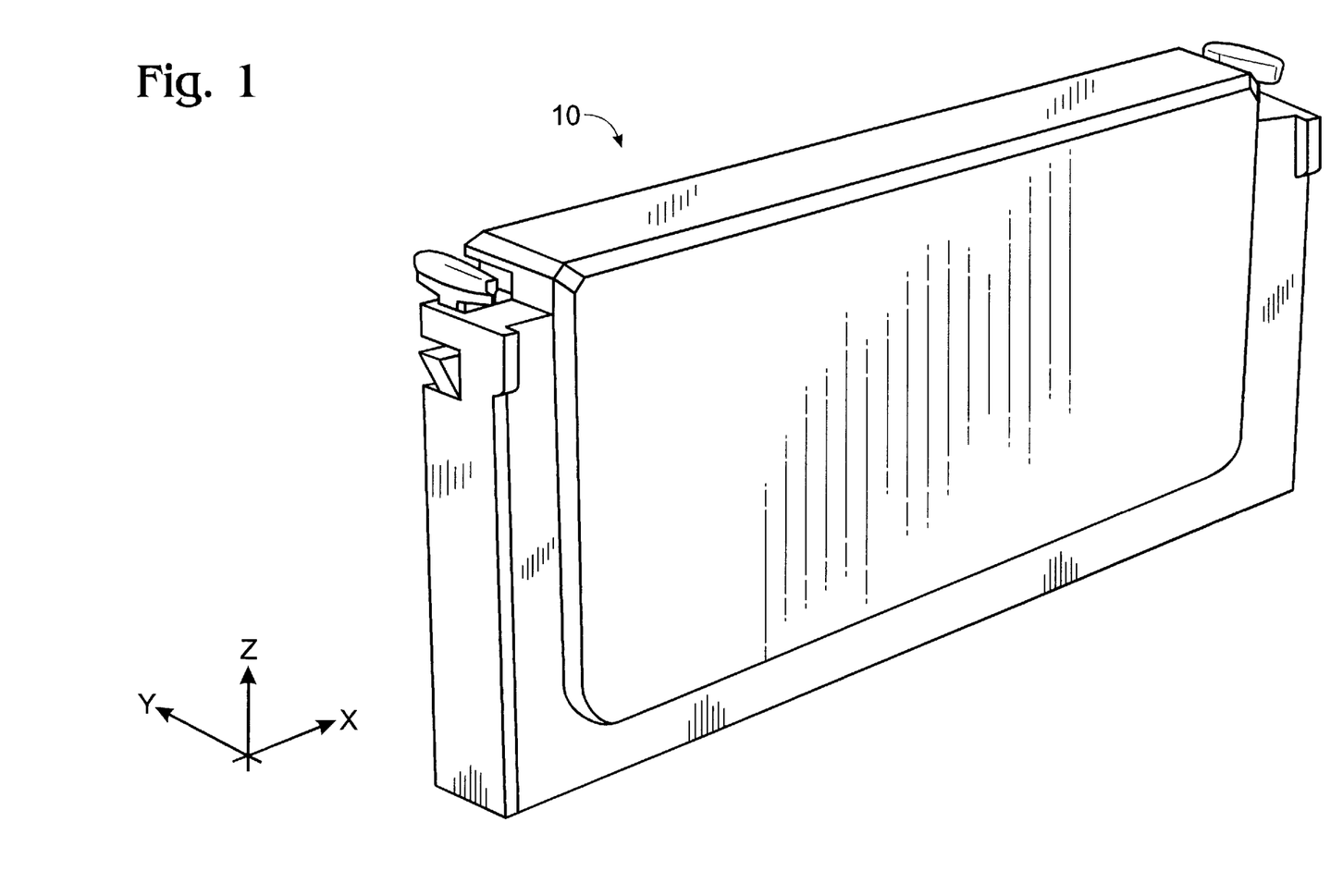
FIG. 1 is an assembled view of one embodiment of the processor card assembly of the present invention.
Figure 2:
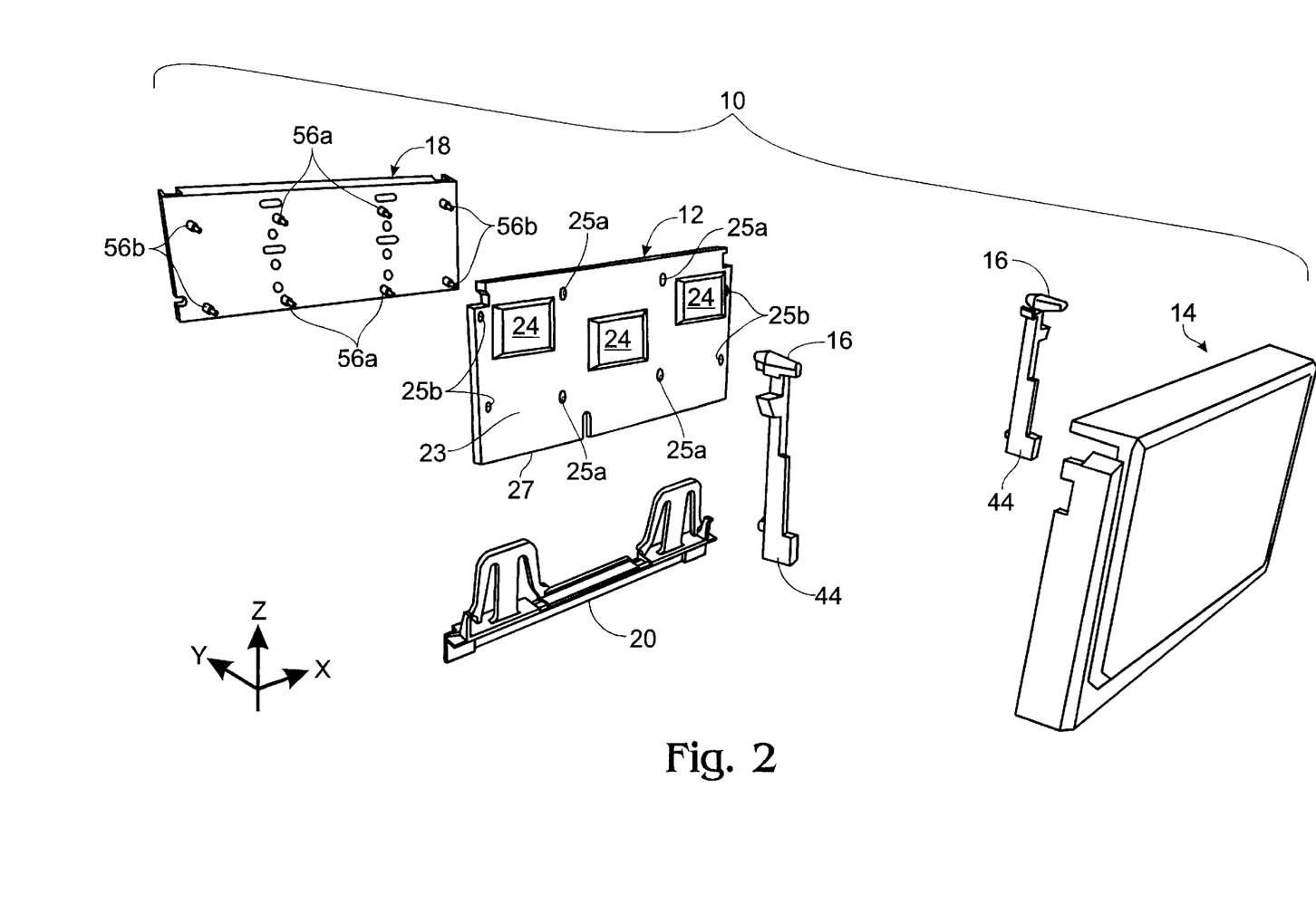
FIGS. 2–3 are exploded views of the processor card assembly of FIG. 1.
Figure 3:
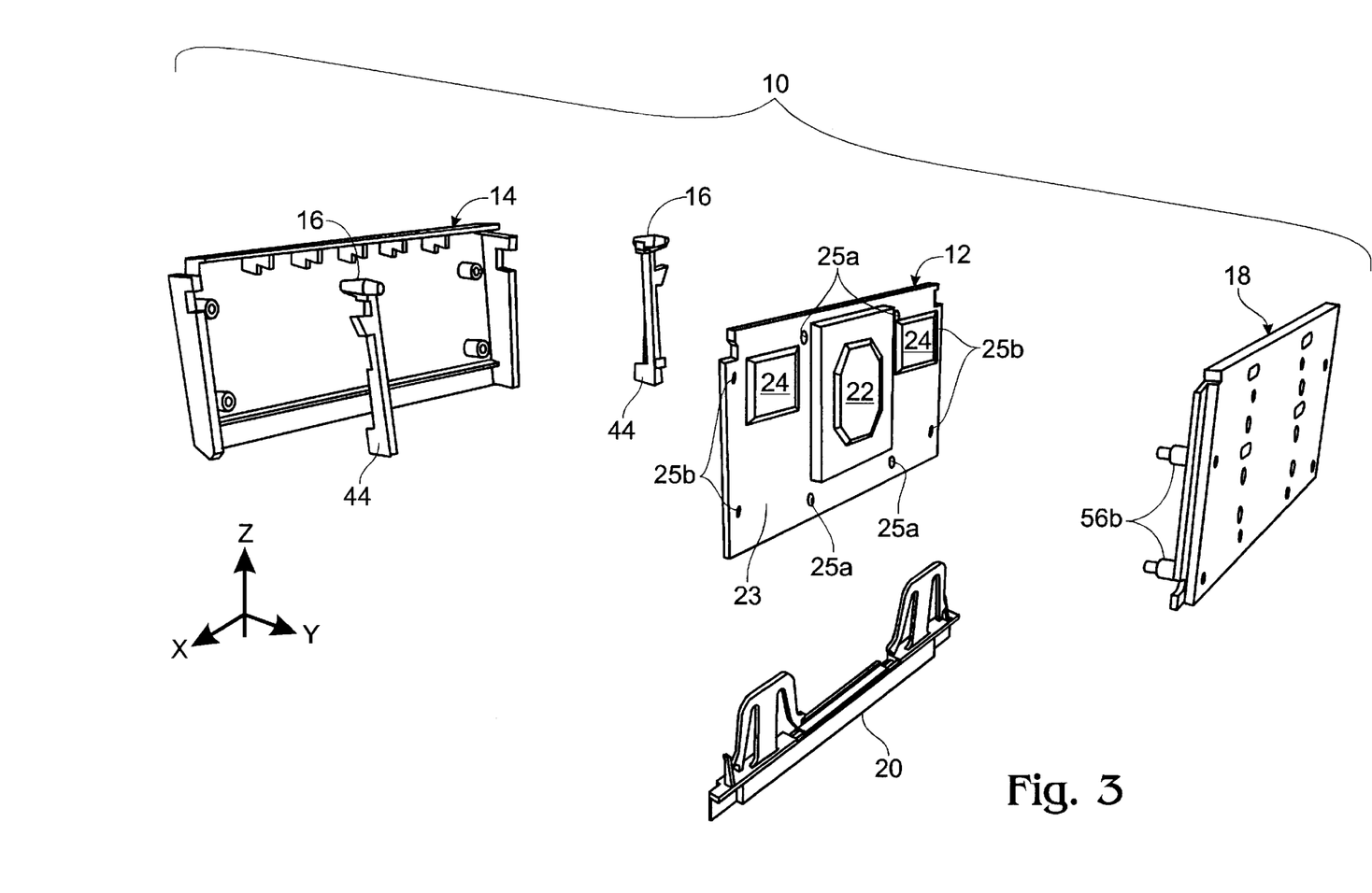

Referring now to FIG. 1–3, wherein an assembled view and two exploded views of one embodiment of the processor card assembly of the present invention 10 are shown. For the illustrated embodiment, processor card assembly 10 comprises processor card 12, cover 14, and thermal plate 18. Cover 14 has associated locking latches 16, while thermal plate 18 has associated pegs 56a and 56b. Additionally, for the illustrated embodiment, processor card assembly 10 further comprises optional skirt 20.

Processor card 12 are used to mount processor 22 and a number of associated integrated circuits 24. Thermal plate 18 is attached to cover 14 to form a case for housing processor card 12. As will be described in more detail below, in some embodiments, thermal plate 18 and cover 14 employ temper resistant fastening features, such that process card 12 is protected from tempering. Thermal plate 18 is also used as a base for thermally coupling processor 24 to a heat sink (not shown) to be mounted on thermal plate 18. Thermal plate 18 and cover 14 also form a Faraday cage for electromagnetically shielding EMI emissions from processor 24, as well as for providing ESD protection to processor card 12. In other words, thermal plate 18 serves multiple purposes, physically as a side wall of the housing, thermally as a mounting base for a heat sink, electromagnetically as a containment wall of the Faraday cage. Optional skirt 20 is used to cover and protect connecting pins 27 of processor card 12.

As will be also described in more details below, locking latches 16 are used to latch processor card assembly 10 to a retention apparatus for retaining processor card assembly 10, such that processor card 12 will remain connected to a receiving connector (not shown) of a motherboard (not shown), notwithstanding having experienced a series of shocks and vibrations up to certain predetermined magnitude. An example of a retention apparatus suitable for retaining processor card assembly 10 is disclosed copending U.S. patent application Ser. No. 08/741,023, entitled "Processor Card Assembly Retention Apparatus", filed contemporaneously with the present application, and having common assignee interest with the present application, which is hereby fully incorporated by reference.

Continuing to refer to FIGS. 1–3, for the illustrated embodiment, processor card 12 includes circuit board 23 and a number of heat dissipating integrated circuits 22 and 24 mounted thereon. In particular, integrated circuits 22 and 24 include processor 22. Some of the integrated circuits 24, including processor 22, are disposed on the thermal plate side of circuit board 23, while other integrated circuits 24 are disposed on the back cover side of circuit board 23. Circuit board 23 includes a first set of pre-drilled holes 25a for facilitating attachment of thermal plate 18 to circuit board 23, and a second set of pre-drilled holes 25b for facilitating attachment of thermal plate 18 to cover 14. Processor card 12 further includes connector pins 27 disposed on a first edge of circuit board 23 for connecting processor card 12 to the motherboard in the -Z direction, by way of mating with the receiving connector disposed on the motherboard.

The number integrated circuits 24 shown, and the fact that some are disposed on one face of circuit board 23 while others are disposed in an opposing face, are for illustrative purpose only. Except for processor 22, and its disposition on the thermal plate side of circuit board 23, for the purpose of this invention, any number of integrated circuits may be included in processor card 23, and the non-processor integrated circuits 24 may be disposed on both faces or on one face, and if they are all disposed on one face, it could be either face.

Similarly, the fastening features, i.e. locking latches, pre-drilled holes, pegs, etc., described or to be described, are intended for illustrative purpose only, these fastening features may be substituted with any one of a number of functionally equivalent fastening features known in the art or subsequently developed.

Figure 4:
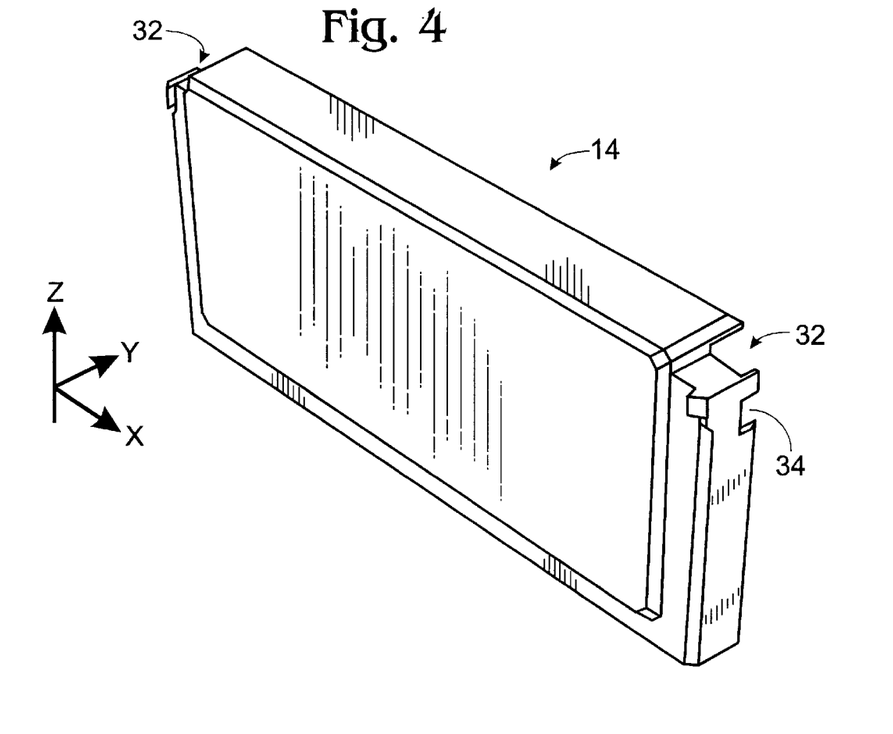
FIGS. 4–5 illustrate the cover in further detail.
Figure 5:
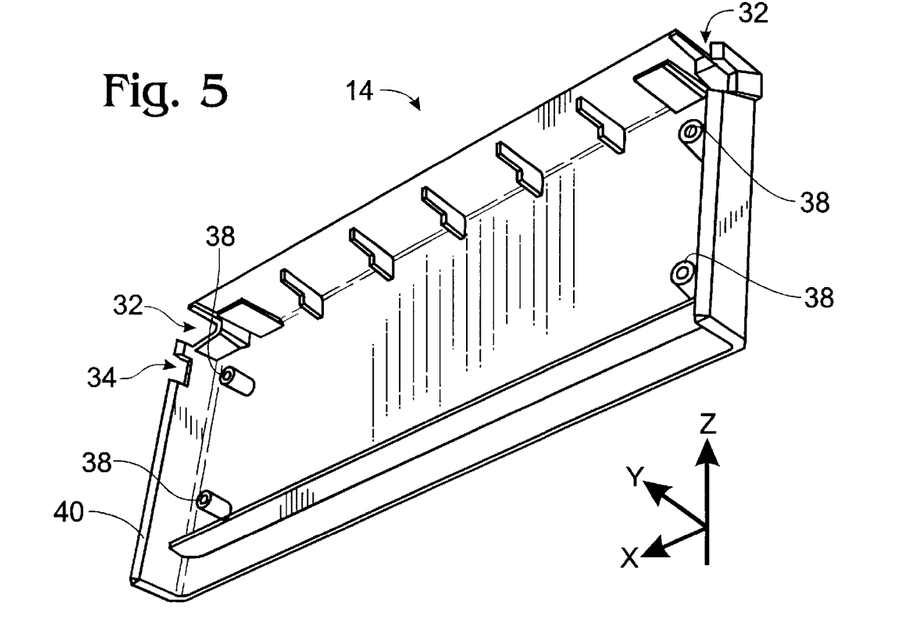

Referring now to FIGS. 4–5, for the illustrated embodiment, cover 14 includes a first pair of cavities 40 disposed in its inside face for receiving protruding pedestals 44 of associated locking latches 16, thereby allowing locking latches 16 to be pressed in place and held by cover 14. Cover 14 further includes a pair of notches 32 disposed on its top surface, and a pair of notches 34 disposed on its side surfaces. Both pair of notches 32 and 34 are provided to allow the associated locking latches 16 to flex between an unlocked and a locked position, for latching processor card assembly to an retention apparatus. As will be appreciated by those skilled in the art, by having locking latches 16 associated with back cover 14, the process for engaging processor card assembly 10 to a retention apparatus, such as the one disclosed in the above incorporated by reference US Patent Application is streamlined, thereby significantly improving the manufacturability of motherboards using high performance processors.

Additionally, cover 14 further includes a number of bosses 38 disposed on its inside surface for receiving protruding pegs 56b associated with thermal plate 18, thereby allowing thermal plate 18 to be easily and securely joined with cover 14 in a temper resistance manner to form the above described case, to be more fully described below. For the illustrated embodiment, cover 14 is made of plastic materials with its inside surface electro-plated, thereby allowing cover 14 to function as a containment wall of a Faraday cage. In an alternate embodiment, instead of electroplating the inside surface of cover 14 constituted with plastic material, it may be "lined" with a sheet of metal. In yet another alternate embodiment, cover 14 may be constituted with metallic substance.

Figure 6:
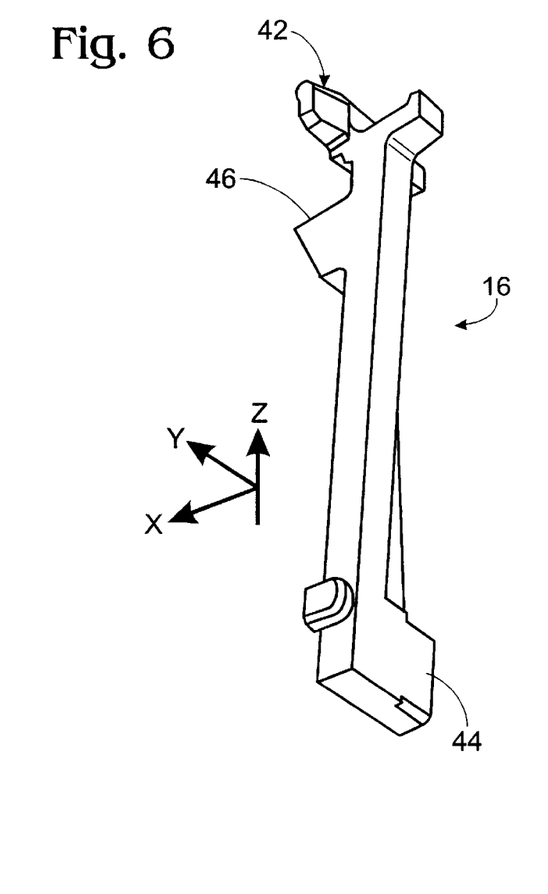
FIGS. 6–7 illustrate the associated locking latches in further detail.
Figure 7:
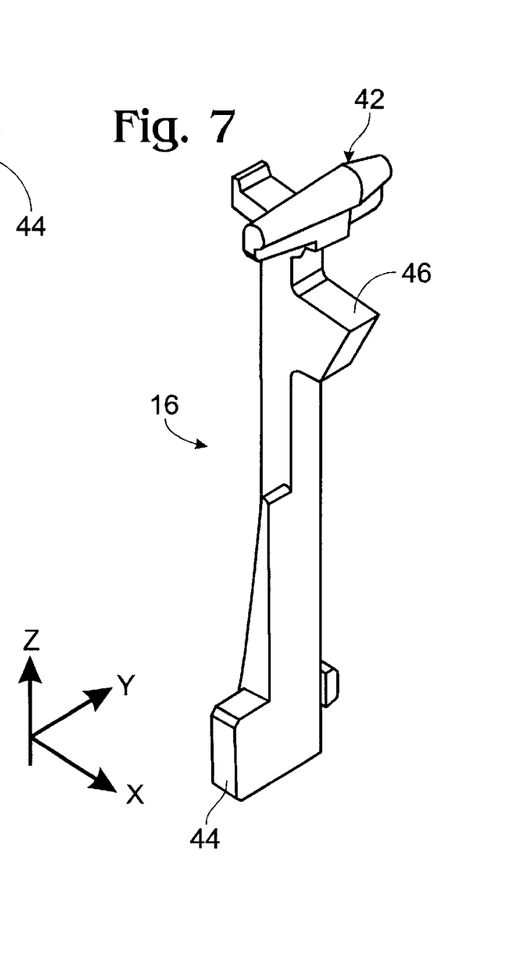

Referring now FIGS. 6–7, wherein one embodiment of a locking latch 16 is illustrated in further detail. For the illustrated embodiment, locking latch 16 includes protruding pedestal 44 for easily joining locking latch 16 to back cover 14 as described earlier. Locking latch 16 further includes protruding ledge 46 for engaging a window disposed on a retention arm of the retention apparatus, thereby latching processor card assembly 10 to the retention apparatus. Locking latch 16 also includes handle 42 for allowing locking latch 16 to be held and flex from the unlocked position to the locked position, and vice versa.

Figure 8:
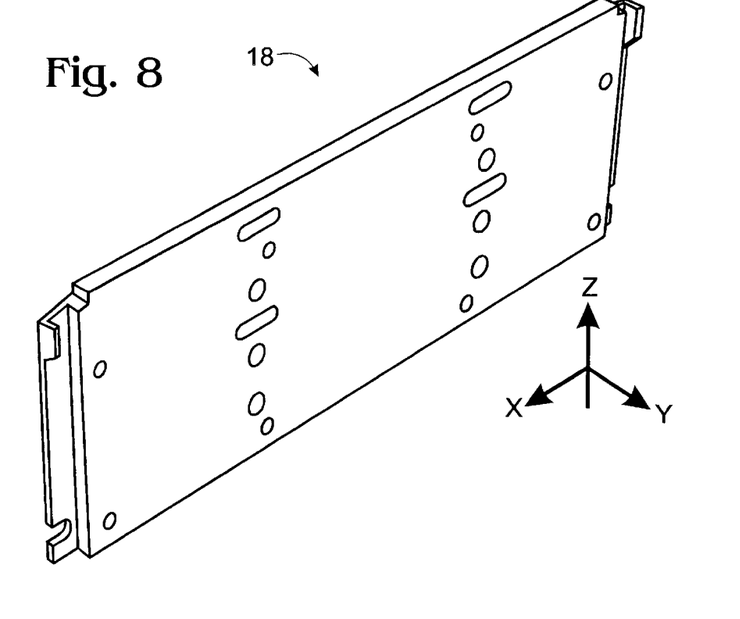
FIGS. 8–9 illustrate the thermal plate in further detail.
Figure 9:
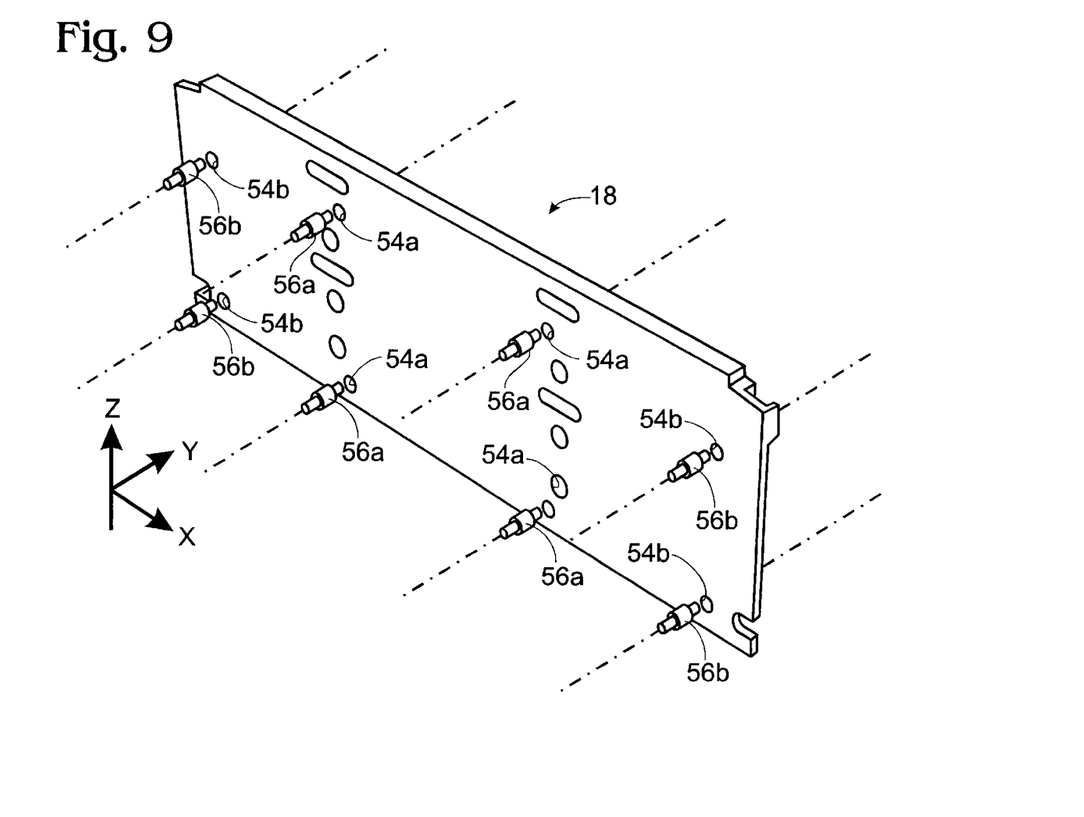

Referring now to FIGS. 8–9, wherein one embodiment of thermal plate 18 is illustrated in further detail. For the illustrated embodiment, thermal plate 18 includes a first set of pre-drilled holes 54a for receiving a first plurality of pegs 56a for easily attaching thermal plate 18 to circuit board 23, and a second set of pre-drilled holes 54b for receiving a second plurality of pegs 56b for easily and securely attaching thermal plate 18 to cover 14 as described earlier. For the illustrated embodiment, peg 56b are barbed. Similar to circuit board 23, the fastening features, i.e. pre-drilled holes 54a and 54b, as well as pegs 56a and 56b, etc. may be replaced with any one of a number of functionally equivalent fastening features known in the art or subsequently developed.

Figure 10:
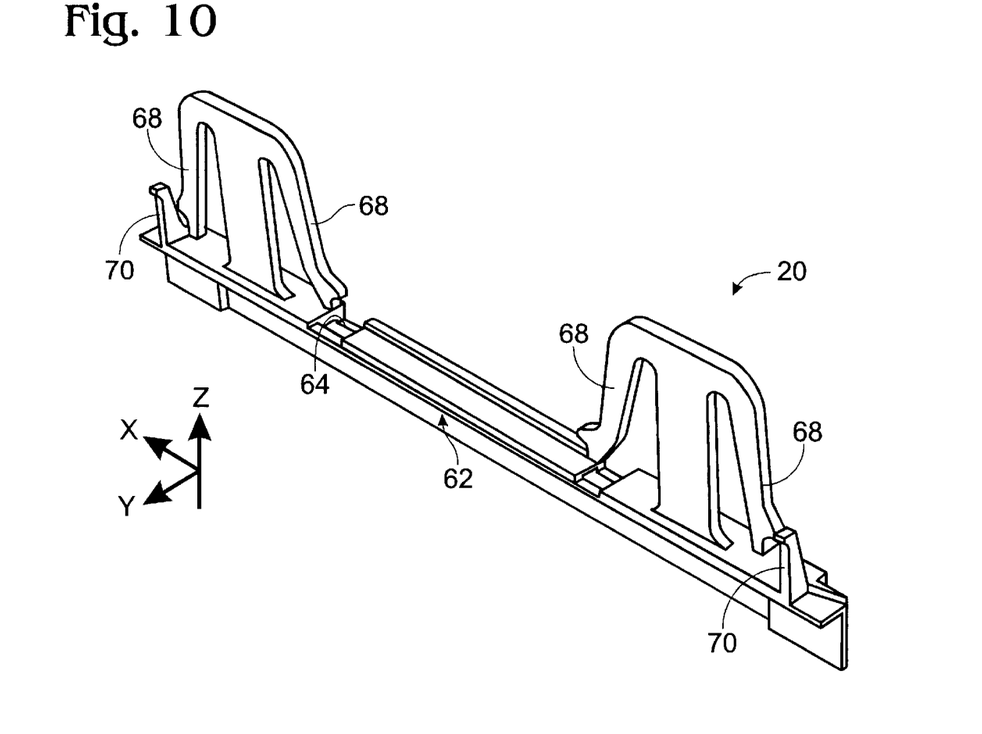
FIGS. 10–11 illustrate the optional skirt in further detail.
Figure 11:
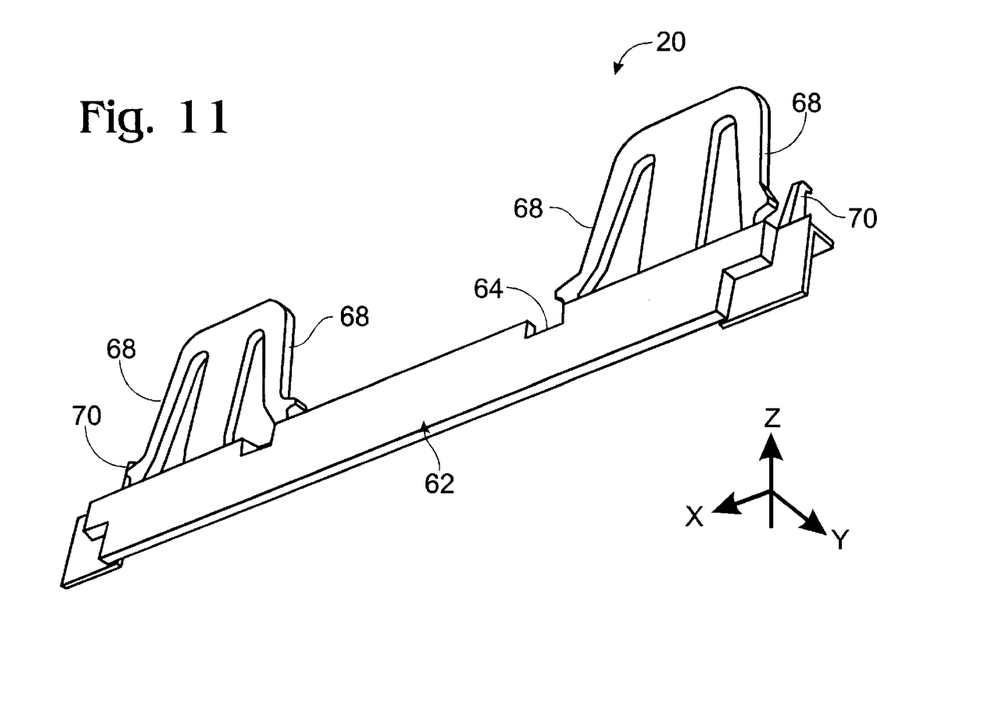

Referring now to FIGS. 10–11, wherein one embodiment of optional skirt 20 is illustrated in further detail. For the illustrated embodiment, optional skirt 20 includes a number of snap arms 68 for mating with pegs 56a and 56b for securing optional skirt 20 to processor card assembly 10.

Additionally, optional skirt 20 also includes fingers 70 for facilitating alignment with processor card 12, and apron 62 for covering and protecting pins 27 of circuit board 21.

While the apparatus of the present invention has been described in terms of the above illustrated embodiment, those skilled in the art will recognize that the invention is not limited to the embodiments described. The present invention can be practiced with modification and alteration within the spirit and scope of the appended claims. The description is thus to be regarded as illustrative instead of restrictive on the present invention.

Thus, a processor card assembly having a cover with locking latches has been described.

What is claimed is:

1. A processor card assembly comprising:

a processor card including a circuit board having a processor mounted thereon;

a thermal plate having a first plurality of fastening features; and a cover having a second plurality of fastening features, and a pair of locking latches flexibly attached to opposite ends of the cover, the second plurality of fastening features cooperating with the first plurality of fastening features to allow the thermal plate and the cover to form a case for housing the processor card, and the locking latches being used to latch the processor card assembly to a retention apparatus by flexing the locking latches in opposing outward directions.

2. The processor card assembly as set forth in claim 1, wherein each of the locking latches includes a protruding ledge for mating with a window of a retention arm of the retention apparatus.

3. The processor card assembly as set forth in claim 1, wherein the cover further includes a plurality of cavities disposed in an inside surface of the cover; and each of the locking latches includes a protruding pedestal for facilitating pressing in place the locking latch against one of the cavities, and allowing the locking latch to be flexibly held by the cover.

4. The processor card assembly as set forth in claim 1, wherein the cover further includes a first plurality of notches disposed on a top surface of the cover, and a second plurality of notches disposed on side surfaces of the cover for allowing the locking latches to flex from an unlocked position to a locked position, and vice versa.

5. The processor card assembly as set forth in claim 1 wherein the processor card includes a plurality of pre-drilled holes;

the first plurality of fastening features are a plurality of barbed pegs; and the second plurality of fastening features are bosses disposed on an inside surface of the cover for receiving the barbed pegs, which mate with the bosses through the pre-drilled holes.

6. The processor card assembly as set forth in claim 1, wherein the processor card assembly further includes a skirt for covering and protecting connecting pins of the processor card.

7. The processor card assembly as set forth in claim 6, wherein the skirt further includes a plurality of fingers for facilitating alignment with the processor card.

8. The processor card assembly as set forth in claim 6, wherein the processor card includes a plurality of pre-drilled holes disposed on a face of the circuit board;

the thermal plate includes a plurality of associated pegs for mating with the pre-drilled holes to attach the thermal plate to the processor card; and the skirt includes a plurality of snap arms for mating with the pegs to attach the skirt to the processor card assembly.

9. A processor card assembly comprising:

a processor card including a circuit board having a processor mounted thereon, and a first plurality of fastening features;

a thermal plate having a second plurality of fastening features cooperating with the first plurality fastening features for joining the thermal plate and the processor card; and a skirt having a third plurality of fastening features cooperating with the second plurality of fastening features for attaching the skirt to the processor card assembly for covering and protecting connecting pins of the processor card.

10. The processor card assembly as set forth in claim 9, wherein the first plurality of fastening features are a plurality of pre-drilled holes disposed on a face of the circuit board;

the second plurality of fastening features are a plurality of associated pegs for mating with the pre-drilled holes to attach the thermal plate to the processor card; and the third plurality of fastening features are a plurality of snap arms for mating with the pegs to attach the skirt to the processor card assembly.

11. The processor card assembly as set forth in claim 9, wherein the skirt includes a plurality of fingers for facilitating alignment with the processor card.

* * * * *